(12) United States Patent
Baker et al.

(10) Patent No.: US 6,189,766 B1
(45) Date of Patent: Feb. 20, 2001

(54) ZERO STRESS BONDING OF SILICON CARBIDE TO DIAMOND

(75) Inventors: Martin L. Baker, Burnsville, NC (US); William F. Cashion, Oviedo; Fred B. Hagedorn, Orlando, both of FL (US)

(73) Assignee: Northrop Grumman Corporation, Los Angeles, CA (US)

( * ) Notice: Under 35 U.S.C. 154(b), the term of this patent shall be extended for 0 days.

(21) Appl. No.: 09/112,429

(22) Filed: Jul. 10, 1998

(51) Int. Cl.[7] .................................................. G23K 1/19
(52) U.S. Cl. ............................................ 228/121; 428/408
(58) Field of Search .................................. 228/121, 122.1, 228/124.7; 428/408

(56) References Cited

U.S. PATENT DOCUMENTS

| | | | | |
|---|---|---|---|---|
| 4,880,154 | * | 11/1989 | Tank ...................................... | 228/122 |
| 5,161,728 | * | 11/1992 | Li .......................................... | 228/124 |
| 5,411,758 | * | 5/1995 | Simpson ............................... | 427/249 |
| 5,632,435 | * | 5/1997 | Schmied et al. ...................... | 228/121 |
| 5,653,378 | * | 8/1997 | Olson, Jr. et al. ................. | 228/124.1 |
| 6,045,029 | * | 4/2000 | Scott .................................... | 228/122.1 |

* cited by examiner

Primary Examiner—Archene Turner

(57) ABSTRACT

A multi-layer structure including a first layer; a second layer, with a coefficient of thermal expansion different than a coefficient of thermal expansion of the first layer, a bulk modulus different than a bulk modulus of the first layer and a thermal conductivity different than a thermal conductivity of the first layer; a bonding layer, having an isostatic pressure versus temperature curve with one of the first layer and the second layer which is substantially similar to an isostatic pressure versus temperature curve of the first layer and the second layer, such that a substantially stress-free bond is formed between the first layer and the second layer; wherein the first layer, the second layer, and the bonding layer are arranged as a sandwich, with the bonding layer in between the first layer and the second layer. The bonding layer may also be optional, in principle, and the first layer and the second layer bonded by diffusion, if the first layer and the second layer have sufficiently low melting temperatures.

6 Claims, 2 Drawing Sheets

ZERO STRESS BONDING OF SILICON CARBIDE TO DIAMOND

BACKGROUND OF THE INVENTION

The invention generally relates to an apparatus and method which achieve a bond between two or more materials of a composite structure, with differing thermal coefficients of expansion. In particular, the apparatus and method of the present invention produce a stress-free composite structure of silicon carbide and diamond.

High power RF transistor needs are increasingly being upgraded so that they are required to produce more power in less area. This places a greater emphasis on heat removal since these devices are made of semiconductor materials which exhibit degraded performance when their temperatures increase. In addition, many of the conventional high power RF devices are operated in a pulse mode which requires not only good thermal conductivity (for steady-state heat removal), but also requires very high thermal diffusivity to quickly spread the heat from the heat generating area. Table 1 shows the thermal properties of common semiconductor materials and other heat spreading materials.

TABLE 1

| Material | Heat Capacity (J/gmc°) | Thermal Conductivity (w/cm°K) | Thermal Diffusivity (cm²/sec) | Density (g/cm³) |
| --- | --- | --- | --- | --- |
| GaAs | 0.3 | 0.46 | 0.248 | 5.3 |
| Si | 0.7 | 1.5 | 0.93 | 2.3 |
| SiC | 0.628 | 4.5 | 2.23 | 3.2 |
| Cu/W(15%) | 0.29 | 2.55 | 0.54 | 16.4 |
| Beryllium Oxide | 1.05 | 0.25 | 0.084 | 2.85 |
| Diamond | 0.51 | 15 to 20 | 9.47 | 3.52 |

To achieve these higher powers and greater heat dissipation, the assembled transistor package must have a small thermal resistance between the actual power absorbing volume and the exterior surface in contact with some form of air flow cooling. This application would be applicable for any number of active or passive devices which generate or collect energy (heat). In addition, the material closest to the actual power absorbing volume should have a very high thermal diffusivity so that high transient thermal pulses can be spread rapidly away from the heat creating sites. A candidate to accomplish both of these is shown in FIG. 1.

FIG. 1 illustrates a SiC/diamond stack 100, which includes a diamond layer 102 with a thickness L, bonding material 104, with a thickness that is virtually zero, and a silicon carbide die 106 with heat creating sites 108 formed on an upper portion thereof. Although not required, in this example the silicon carbide die 106 has a thickness approximately equal to the diamond layer 102.

The thermal conductance of this SiC/Diamond stack 100 is 17 times better than a comparable Si/BeO stack. In addition, the diamond layer 102 provides a 4.2x improvement in thermal diffusivity over the SiC itself. The problem with such a solution is that the stack 100 cannot conventionally be bonded together. Stresses which result from the different coefficients of thermal expansion (CTE) either tear the bonding material 104 or fracture the stacking materials when cooled to operational temperatures. The bonding materials of choice are metals rather than epoxies because of the need for low thermal resistance. The metal chosen, for example, titanium or titanium nickel, must also have a solidification temperature higher than the highest operating temperature. The assembly of the stack 100 is thus done at temperatures up to 100° C. higher than the upper operation temperature at the material interfaces. The maximum CTE stresses which result when cooled to the lowest operating temperature result in fracture or debonding. It is this problem that is addressed in this disclosure.

SUMMARY OF THE INVENTION

It is an object of the present invention to achieve a bond between two or more materials of a composite structure, with different thermal coefficients of expansion, such that the composite structure does not fracture or debond.

It is further another object of the present invention to provide a multi-layer structure including a layer of silicon carbide and a layer of diamond, bonded together, which does not fracture or debond.

The present invention achieves these objects by providing a multi-layer structure, comprising: a first layer; a second layer, with a coefficient of thermal expansion different than a coefficient of thermal expansion of said first layer, a bulk modulus different than a bulk modulus of said first layer and a thermal conductivity different than a thermal conductivity of said first layer; a bonding layer, having an isostatic pressure versus temperature curve with one of said first layer and said second layer which is substantially similar to an isostatic pressure versus temperature curve of said first layer and said second layer, such that a substantially stress-free bond is formed between said first layer and said second layer; wherein said first layer, said second layer, and said bonding layer are arranged as a sandwich, with the bonding layer in between said first layer and said second layer.

The present invention also achieves these objects by providing a process for bonding together a silicon carbide layer and a diamond layer, yielding a composite structure which is substantially stress-free at a selectable reference temperature and reference isostatic pressure, comprising the steps of: (a) providing the silicon carbide layer and the diamond layer; (b) determining a critical line for the silicon carbide layer and the diamond layer in a pressure-temperature plane wherein a location of the critical line depends on the selectable reference temperature and reference isostatic pressure and depends on coefficients of thermal expansion and bulk moduli material constants of the silicon carbide layer and the diamond layer, wherein the critical line sets forth a plurality of temperature-pressure pairs at which the composite structure will be substantially stress-free; (c) controlling a temperature and an isostatic pressure during bonding such that the temperature and the isostatic pressure represent a point on the critical line; (d) bonding the silicon carbide layer and the diamond layer at the temperature and the isostatic pressure in said step (c); and (e) returning to the selectable reference temperature and reference isostatic pressure after bonding is completed by following a path along the critical line for the silicon carbide layer and the diamond layer which avoids imposing disruptive stresses on the composite structure.

Finally, the present invention achieves these objects by providing an apparatus for bonding together a silicon carbide layer and a diamond layer, yielding a composite structure which is stress-free at a selectable reference temperature and reference isostatic pressure, comprising: (a) means for supporting the silicon carbide layer and a diamond layer; (b) means for determining a critical line for the silicon carbide layer and the diamond layer in a pressure-temperature plane, wherein a location of the critical line depends on the selectable reference temperature and reference isostatic pressure and depends on coefficients of thermal expansion and bulk moduli material constants of the silicon carbide layer and the diamond layer, wherein the critical line sets forth a plurality of temperature-pressure pairs at which the composite structure will be substantially stress-free; (c) means for controlling a temperature and isostatic pressure during bonding such that the temperature and the isostatic pressure represent one or more points on the critical line; and (d) means for bonding the silicon carbide layer and the diamond layer at the temperature and the isostatic pressure in said step (c); (e) means for returning to the selectable temperature and reference isostatic pressure after bonding is complete by following a path along the critical line for the silicon carbide layer and the diamond layer which avoids imposing disruptive stresses on the composite structure.

As described above, there may exist a set of points defining a line where these locus of points represent a selection of pressures and temperatures. Movement between any two points on this P-T line will result in an identical change in area of both of the two components. This line, sometimes a curved line, is referred to in this application as a critical line.

BRIEF DESCRIPTION OF THE DRAWINGS

The present invention will become more fully understood from the detailed description given hereinbelow and the accompanying drawings, which are given by way of illustration only, and thus do not limit the present invention, wherein.

Further scope of applicability of the present invention will become apparent from the detailed description given hereafter. However, it should be understood that the detailed description and specific examples, while indicating preferred embodiments of the invention, are given by way of illustration only since various changes and modifications within the spirit and scope of the invention will become apparent to those skilled in the art from this detailed description.

DETAILED DESCRIPTION OF THE PREFERRED EMBODIMENT

Figure 1:
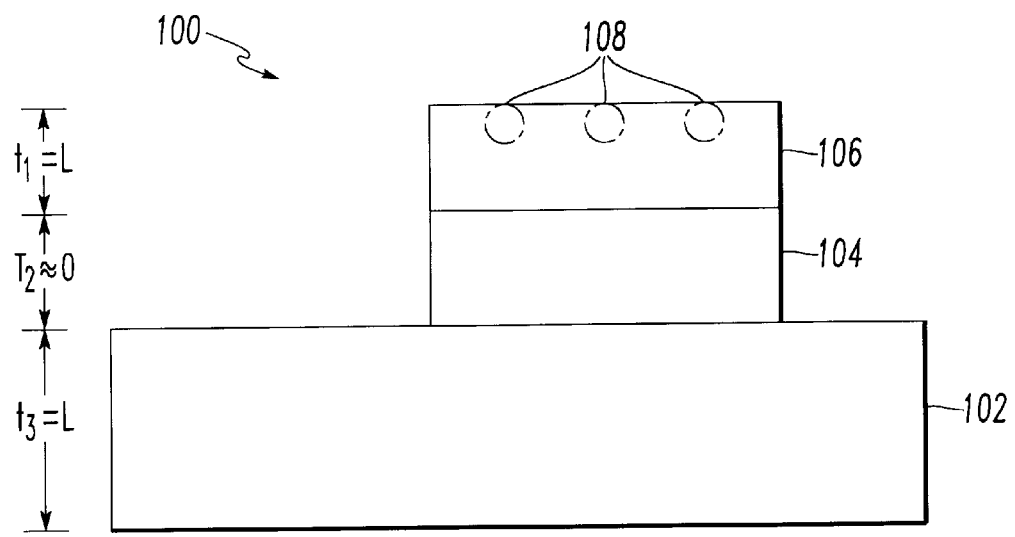
FIG. 1 illustrates a thermal stack with increased thermal conductivity and thermal diffusivity, in accordance with one embodiment of the present invention.

The present invention will be described in connection with FIGS. 1–3.

Consider a case of solder or eutectic bonding of two materials with different CTE's but identical surface areas at a chosen operating temperature. A Material 1/Solder-eutectic/Material 2 sandwich is raised to a temperature where the bonding material liquefies. The bonding material is then squeezed to an infinitesimal thickness so that it does not of itself place any stress on the materials being bonded. One can then increase the pressure isostatically until the size (not thickness) of materials 1 and 2 is identical. The volume compression of each material is dependent on its Young's Modulus and Poisson Ratio through the expression $$E = 3\beta(1-2\sigma)$$

where E is Young's Modulus
$\sigma$ is Poisson's Ratio
$\beta$ is bulk modulus of volume elasticity
The modulus of volume elasticity is defined as $$\beta = \frac{\text{Compression Stress}}{\text{Volume Strain}}$$

so that for a given isostatic pressure (compressional stress) one can change the volume of each material a different amount as long as each material has E and u values that are different. Thus, there exists material pairs for which one can find an isostatic pressure which makes the size (area) of the two dissimilar materials identical. Two properly selected dissimilar materials may then be bonded at a high temperature and have a zero CTE stress between them when they are at a lower temperature and pressure. SiC and PCD are such a material pair.

To accomplish this, an isostatic pressure is applied to make the two properly selected dissimilar materials identical in area at the "freezing point" of the bonding material. The temperature is then reduced. At each reduced temperature, the pressure is adjusted to return the two properly selected dissimilar materials to an identical area. The process continues until the chosen operating condition is reached. In the process of lowering the temperature and adjusting the pressure, the strain in the two properly selected dissimilar materials is kept at zero since identical areas are maintained at all times. Using materials which obey Hooke's law requires that the stress must also be zero. The purpose of constant adjustment of the pressure is to maintain a zero stress condition at all items during the cool down. In a practical sense, this may be too expensive. The process can be simplified to using finite step adjustments as long as the stress that builds up between steps does not fracture or debond the stack.

The ideal choice for the bonding material is to select a bonding material or engineer a new bonding material which has a critical pressure-temperature line with one of the components to be bonded which is similar to the critical pressure-temperature line of the two components to be bonded. FIG. 2 illustrates such a bonding material as Material A.

Figure 2:
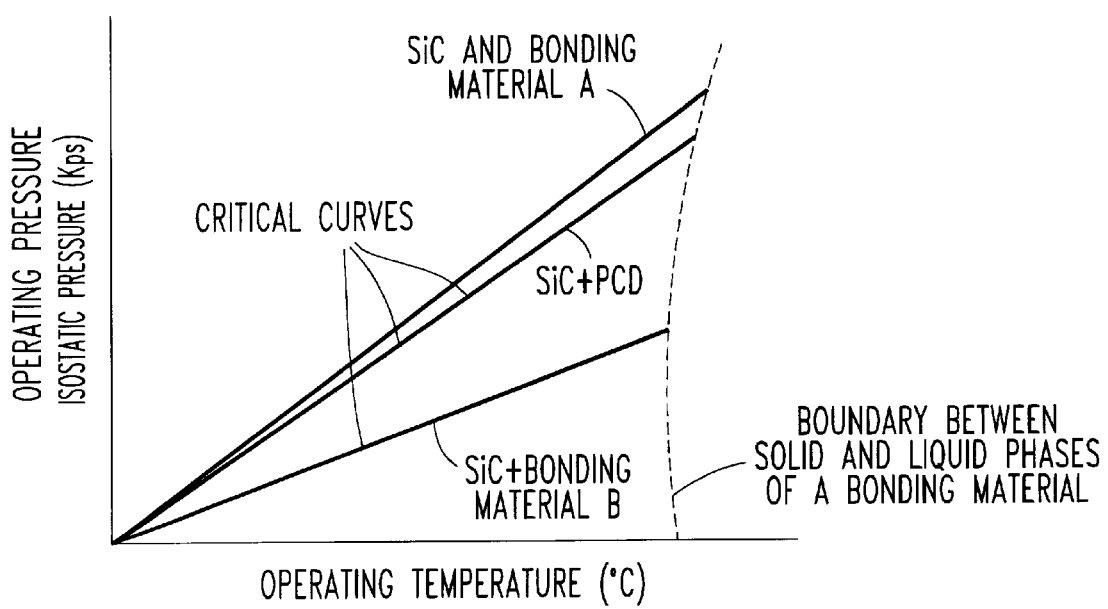
FIG. 2 illustrates three pressure-temperature curves, one for SiC/bonding material candidate A, one for SiC/bonding material candidate B, and the pressure-temperature curve for SiC/polycrystalline diamond (PCD)

FIG. 2 illustrates the required pressure as a function of temperature to cause either SiC and bonding material A or SiC and bonding material B to match the expansion of SiC/PCD.

The SiC/Bonding Material A curve substantially matches the SiC/PCD temperature-pressure line but the SiC/bonding Material B does not closely match the SiC/PCD temperature-pressure line. If Material A were chosen as the bonding material and the inventive process described earlier were used, then the resulting bonded composite would have zero stress on all components when at its operating temperature and operating pressure conditions. If Material B were chosen and the inventive process described earlier was applied using the SiC/PCD temperature/pressure line, then the resulting bonded composite would have residual stresses at the operating temperature and operating pressure conditions.

If the bonding Material B is made very thin, compared to the bonding pieces, the stresses on the much larger composite pieces could be neglected. Therefore, the only stress of concern is that in the bonding material itself. The magnitude of this stress is dependent on the Material B physical parameters and how far the SiC/Material B critical temperature/pressure line deviates from the SiC/PCD critical line. If a nearly perfect match, such as bonding Material A, is not obtainable, one can find a solution by selecting a material B with a sufficiently close-matched critical curve with SiC which reduces the internal stress below its fracture strength. Material B in this case, can either be a known material such as solder, or a new engineered material to meet the fracture strength criteria just mentioned.

Thus, there exists a method which uses isostatic pressure as a new degree of freedom to form a bond at a high temperature between two materials of different CTE's and different bulk moduli and then reduce the temperature to some operating (lower) temperature resulting in zero or acceptably small stress in the two materials and either zero acceptably small stress in the bond material.

One can derive a mathematical equation for the critical line in the P-T plane. To do this derivation, one starts with expressions for the fractional length changes introduced by temperature and pressure:

$$(\Delta l/l)_{td} = \int_{T_r}^{T} \alpha_d(T, P) dT \qquad \text{Eq. (1)}$$

$$(\Delta l/l)_{ts} = \int_{T_r}^{T} \alpha_s(T, P) dT \qquad \text{Eq. (2)}$$

$$(\Delta l/l)_{pd} = \int_{P_r}^{P} [3\beta_d(T, P)]^{-1} dP \qquad \text{Eq. (3)}$$

$$(\Delta l/l)_{ps} = \int_{P_r}^{P} [3\beta_s(T, P)]^{-1} dP \qquad \text{Eq. (4)}$$

where the subscripts "d" and "s" refer to diamond and substrate, where the subscripts "t" and "p" refer to temperature and pressure, wherein the CTE's are given by $\alpha$'s and are shown explicitly to be functions of temperature and pressure, where the bulk moduli are given by $\beta$'s and are also shown explicitly to be functions of temperature and pressure, wherein $T_r$ and $P_r$ are reference temperatures and pressures, respectively, and where T and P are the temperature and pressure on the P-T plot. The factor of 3 in Eqs. (3) and (4) results from equating the fractional volume change to 3 times the fractional length change, which is an excellent approximation when ($\Delta l/l$) is much less than unity.

Equating the difference between Eq. (1) and Eq. (3) to the difference between Eq. (2) and Eq. (4) leads to the equation for the critical line in the P-T plane. The simplified case where both the CTEs and the bulk moduli are considered constants will be discussed as an example. In this case, the equation for the critical line becomes $$(P-P_r)(\beta_d - \beta_s) = 3\beta_d \beta_s (\alpha_s - \alpha_d)(T-T_r) \qquad (5)$$

The bulk modulus is related to the Young's modulus (E) according to $$E = 3\beta(1-2\sigma) \qquad (6)$$

where $\sigma$ is Poisson's ratio.

The bonding material could introduce stress into the composite structure if the bonding layer were not extremely thin. Since the thermal conductivity of PCD is very high, it is likely that the thermal conductivity of any selected bonding material will be lower, therefore requiring that the selected bonding material be as thin as possible.

Therefore, two dissimilar materials, SiC and PCD can be bonded stress free at an elevated temperature provided their thermal coefficients and bulk moduli are such that Equation (5) can be satisfied with $P > P_r$ and $T > T_r$.

Equation (5) can be applied to the bonding material, as well as the substrate material. As a result, if the bonding material has values for its CTE, Young's modulus, and Poisson's ratio such that the critical line in the P-T plot for the PCD-bonding material pair coincides with or is near to the critical line for the PCD-substrate material pair, then a three-layered structure will remain stress-free at any point on that line.

In one embodiment, a "hot isostatic pressure" (HIP) process is used to ensure a proper bond among many choices of bonding material and substrates.

Figure 3:
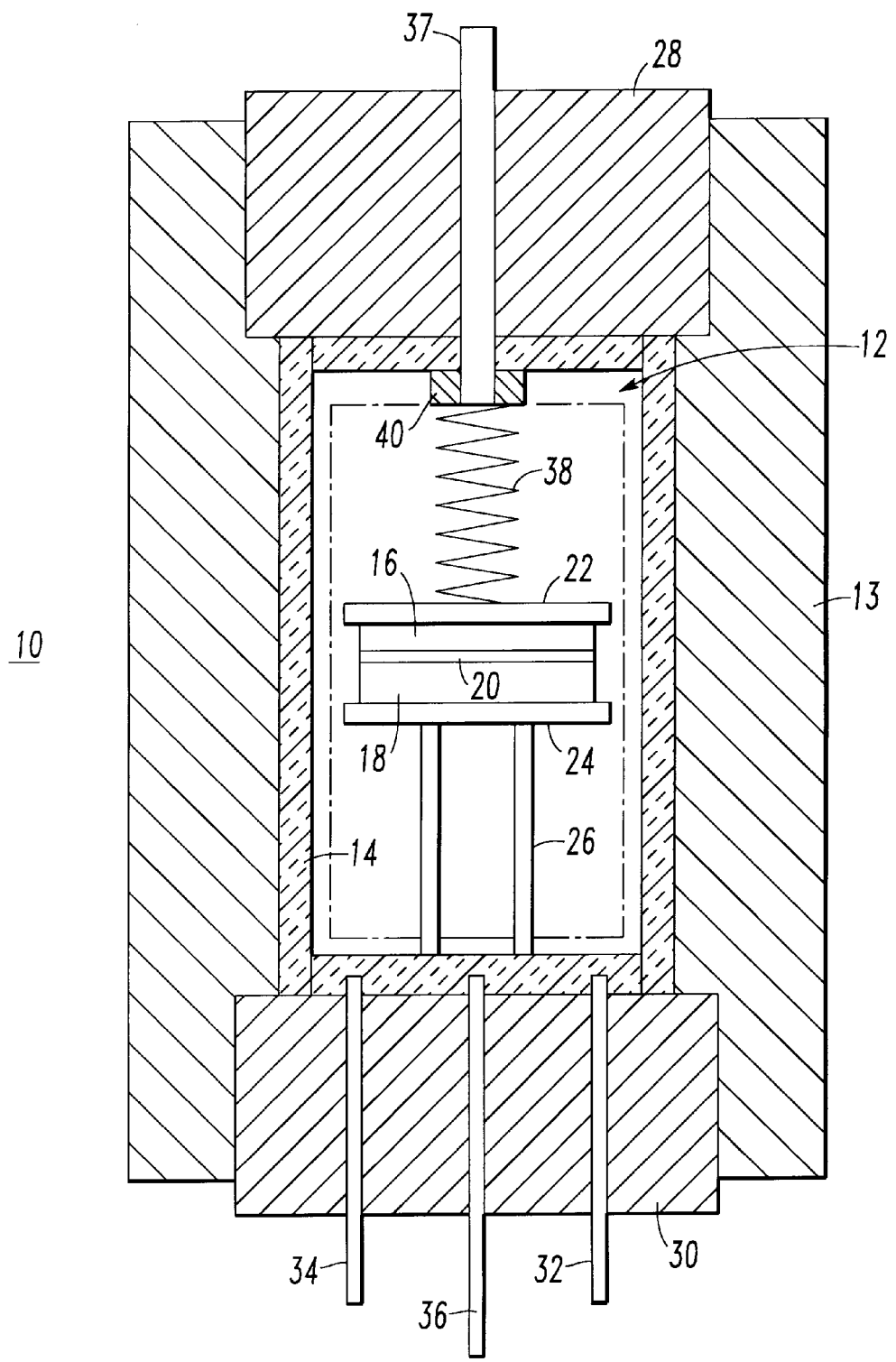
FIG. 3 illustrates a hot isostatic pressure (HIP) bonding apparatus utilized in one embodiment of the present invention.

The HIP bonding apparatus 10, in one embodiment of the present invention, is illustrated in FIG. 3. The HIP bonding apparatus 10 includes a high-pressure cylindrical chamber 12 with a wall 13 which is 3½ inches thick and which is insulated with thermal insulation 14. The first layer 16, second layer 18, and an optional bonding layer 20 are placed in the high pressure chamber 12 between upper 22 and lower 24 heater elements which include thermocouples. The bonding layer is optional, in principle, because the first layer 16 and the second layer 18 could be bonded by the temperature, pressure and force with the HIP bonding apparatus 10. However, as a practical matter, SiC and PCD are unlikely to be bonded by diffusion because of their extremely high melting temperatures.

In one embodiment where the bonding layer 20 is utilized, the bonding layer 20 bonds the first layer 16 and the second layer 18 by melting, flowing, and then resolidifying. The first layer 16, the second layer 18, and the bonding layer 20 are supported by holding fixtures 26 within the high pressure chamber 12. The high pressure chamber 12 also doubles as a vacuum chamber during the melting and flowing part of the bonding process. The HIP bonding apparatus 10 includes an upper head assembly 28 and a lower head assembly 30, both of which are 8 inches thick. The lower head assembly 30 includes power lead feed throughs 32, thermocouple feed throughs 34, and a path for argon gas 36. The upper head assembly 28 includes a pipe for vacuum feed through, a spring actuation mechanism 37 and a high pressure valve 40. The spring actuation mechanism 37 imparts a force to spring 38 which forces the first layer 16 and the second layer 18 together inside the high pressure chamber 12.

In a preferred embodiment, a computer is utilized to produce the critical line plots based on Equations (1)–(6) and the temperature and pressure values determined by the computer are input to the HIP bonding apparatus 10.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed:

1. A process for bonding together a silicon carbide layer and a diamond layer, yielding a composite structure which is substantially stress-free at a selectable reference temperature and reference isostatic pressure, comprising the steps of:
   (a) providing the silicon carbide layer and the diamond layer;
   (b) determining a critical line for the silicon carbide layer and the diamond layer in a pressure-temperature plane wherein a location of the critical line depends on the selectable reference temperature and reference isostatic pressure and depends on coefficients of thermal expansion and bulk moduli material constants of the silicon carbide layer and the diamond layer, wherein the critical line sets forth a plurality of temperature-pressure pairs at which the composite structure will be substantially stress-free;

(c) controlling a temperature and an isostatic pressure during bonding such that the temperature and the isostatic pressure represent a point on the critical line;

(d) bonding the silicon carbide layer and the diamond layer at the temperature and the isostatic pressure in said step (c); and (e) returning to the selectable reference temperature and reference isostatic pressure after bonding is completed by following a path along the critical line for the silicon carbide layer and the diamond layer determined in said step (b) which avoids imposing disruptive stresses on the composite structure.

2. The process of claim 1, wherein said step (d), a bonding layer is introduced between the silicon carbide layer and the diamond layer to bond the silicon carbide layer and the diamond layer.

3. The process of claim 1, wherein the bonding layer is made of a metal material.

4. The process of claim 1, wherein bonding in said step (d) occurs at a point or points near the critical line in the pressure-temperature plane.

5. The process of claim 1, wherein the temperature and the isostatic pressure in said step (c) are provided using a hot isostatic pressure (HIP) apparatus.

6. The process of claim 1, wherein a material for the bonding layer is selected or engineered such that a critical line in the pressure-temperature plane for the bonding layer and the silicon carbide layer or a critical line in the pressure-temperature plane for the bonding layer and the diamond layer lies on or substantially near the critical line for the silicon carbide and diamond layers, resulting in a composite structure in which the silicon carbide layer, the diamond layer, and the bonding layer are substantially stress-free when returned to the selectable reference temperature and reference isostatic pressure.

* * * * *